United States Patent
Crewson et al.

(10) Patent No.: US 7,903,434 B2
(45) Date of Patent: Mar. 8, 2011

(54) POWER SWITCH GROUPING

(75) Inventors: Walter Frederick John Crewson, Munsonville, CT (US); Mikael Rolf Lindholm, Enköping (SE)

(73) Assignee: Scandinova Systems AB, Uppsala (SE)

( * ) Notice: Subject to any disclaimer, the term of this patent is extended or adjusted under 35 U.S.C. 154(b) by 339 days.

(21) Appl. No.: 12/144,437

(22) Filed: Jun. 23, 2008

(65) Prior Publication Data
US 2009/0316438 A1 Dec. 24, 2009

(51) Int. Cl.
H02M 3/335 (2006.01)
(52) U.S. Cl. ............ 363/17; 327/304; 307/113; 307/106
(58) Field of Classification Search .................. 363/16, 363/17, 54, 56.08, 71, 89, 127, 131; 323/251, 323/255, 328, 355, 247; 307/106–110, 113, 307/140, 151; 327/181, 183, 304, 471
See application file for complete search history.

(56) References Cited

U.S. PATENT DOCUMENTS

| | | | |
|---|---|---|---|
| 3,590,279 A * | 6/1971 | Thompson et al. ........... 327/177 |
| 5,331,234 A | 7/1994 | Merritt et al. | |
| 5,905,646 A | 5/1999 | Crewson et al. | |
| 6,359,424 B2 * | 3/2002 | Iida et al. ..................... 323/251 |
| 6,597,334 B1 * | 7/2003 | Nakamura ....................... 345/68 |
| 6,741,484 B2 | 5/2004 | Crewson et al. | |
| 6,832,377 B1 * | 12/2004 | Havemose ..................... 718/104 |
| 7,550,876 B2 * | 6/2009 | Cassel ............................ 307/108 |
| 2003/0128554 A1 | 7/2003 | Crewson et al. | |

FOREIGN PATENT DOCUMENTS
WO   WO 2006/004512   12/2006

OTHER PUBLICATIONS
International Search Report mailed Oct. 23, 2009 in corresponding PCT Application PCT/SE2009/050737.

* cited by examiner

*Primary Examiner* — Rajnikant B Patel
(74) *Attorney, Agent, or Firm* — Nixon & Vanderhye P.C.

(57) ABSTRACT

A power modulator comprises a plurality of switched pulse generator sections (22), a power supply arrangement (10), and a transformer arrangement (30). A switch control (24) is connected to said plurality of switched pulse generator sections (22) for providing control signals for turning on and/or turning off them. The switch control (24) is arranged to provide control signals for turning on and/or turning off switched pulse generator sections of a first subset at a first time instant and to provide control signals for turning on and/or turning off switched pulse generator sections of a second subset at a second time instant, different from the first time instant: The second subset is different from the first subset.

19 Claims, 12 Drawing Sheets

POWER SWITCH GROUPING

TECHNICAL FIELD

The present invention relates in general to power systems and in particular to power systems and methods for providing power pulses.

BACKGROUND

Power pulses are utilized in many different types of applications. In many cases, there is a request for pulses having very high momentary power. Typical application areas range from radar systems, particle accelerators, sterilization equipment to high-energy lasers. Common for many such systems is that they require power pulse trains with very high momentary voltage and/or current.

A common approach for supplying such power pulses is to use different kinds of power modulators utilizing energy storage at moderate voltages and transforming short voltage pulses to higher voltages. There are numerous designs of such systems during the last century. Successful such systems in a more recent time are systems as disclosed in the U.S. Pat. Nos. 5,905,646 and 6,741,484, generally known as LCW systems. In these systems, a number of pulse generating modules are connected in parallel to a set of common primary windings of a transformer which have both terminals in common. By controlling the turning-on of the discharge of these pulse generating modules to coincide very accurately, a very high power pulse can be obtained. Such equipment is now well-established on the market in many different fields of use.

Due to the extreme demands in power and/or voltage, there are some limitations in other operational parameters. In a typical system, the pulse repetition rate ranges from 1 to 5000 Hz, while the pulse duration often is in the range of 0.5 to 20 µs. If the repetition rate is requested to be too frequent, the average power is increased and there might be difficulties. The pulse generating modules have to recover between each pulse, and such a recovery time has to be shorter than the requested time between each pulse.

The pulse generating modules are typically charged to a certain voltage during the recovery. During the pulse, typically about 10% of the energy content is released, and the voltage will drop by a smaller amount. If a next pulse is requested to have another voltage, the pulse generating modules have to be charged to this new voltage instead, i.e. they need a certain change-over time to be prepared for the new voltage. If the new voltage is higher than the remaining voltage after the last pulse, it is just a matter of having enough time to fill the energy storage. However, if the new voltage is lower than the previous one, there have to be some arrangements for lowering the voltage over the pulse generating modules. This is technically relatively complex and at the same time, a large portion of the stored energy might have to be wasted. If the output voltage is to be varied quickly, the amount of wasted stored energy may be very large indeed.

The shape of a power pulse is today typically a flat pulse with as sharp rising and falling flank as possible, respectively. Different pulse-forming arrangements are provided to achieve this appearance. In cases other pulse forms are requested, the pulse-forming networks have to be totally redesigned for each pulse shape. Furthermore, if the pulse shape also is requested to change from one pulse to another, dynamic pulse-forming networks have to be developed.

SUMMARY

An object of the present invention is to increase the flexibility of providing high power pulses. A further object of the present invention is to increase the flexibility in terms of pulse separation, pulse voltage and/or pulse shape.

The above mentioned objectives are achieved by devices and methods according to the enclosed patent claims. In general words, in a first aspect, a power modulator comprises a plurality of switched pulse generator sections, a power supply arrangement and a transformer arrangement. The power supply arrangement is connected to inputs of the plurality of switched pulse generator sections for supplying power thereto. A primary side of the transformer arrangement is connected to outputs of the plurality of switched pulse generator sections. The transformer arrangement has an output connected to a secondary side of the transformer arrangement. The power modulator further comprises a switch control, which is connected to the plurality of switched pulse generator sections for providing control signals for at least one of turning on and turning off the plurality of switched pulse generator sections. The switch control is arranged to provide control signals for at least one of turning on and turning off switched pulse generator sections of a first subset of the plurality of switched pulse generator sections at a first time instant and to provide control signals for at least one of turning on and turning off switched pulse generator sections of a second subset of the plurality of switched pulse generator sections at a second time instant. The second time instant is different from the first time instant and the second subset is different from the first subset.

In a second aspect, a method for generation of a series of voltage pulses comprises charging of a plurality of switched pulse generator sections. The method further comprises at least one of connecting and disconnecting switched pulse generators of a first subset of the plurality of switched pulse generator sections to and from, respectively, a load via a transformer arrangement at a first time instant. The method also comprises at least one of connecting and disconnecting switched pulse generator sections of a second subset of the plurality of switched pulse generators to and from, respectively, the load via the transformer arrangement at a second time instant. The second time instant is different from the first time instant and the second subset is different from the first subset.

In a third aspect, a pulse generator arrangement comprises a plurality of switched pulse generator sections. Each of the plurality of switched pulse generator sections has an input for receiving a supply of power. Each of the plurality of switched pulse generator sections has an output intended for providing voltage pulses to a transformer arrangement. The pulse generator arrangement further comprises a switch control, which is connected to the plurality of switched pulse generator sections for providing control signals for at least one of turning on and turning off the plurality of switched pulse generator sections. The switch control is arranged to provide control signals for at least one of turning on and turning off switched pulse generator sections of a first subset of the plurality of switched pulse generator sections at a first time instant and to provide control signals for at least one of turning on and turning off switched pulse generator sections of a second subset of the plurality of switched pulse generator sections at a second time instant. The second time instant is different from the first time instant and the second subset is different from the first subset.

One advantage with the present invention is that power modulators can be utilized for providing a larger variety of pulses or pulse trains.

BRIEF DESCRIPTION OF THE DRAWINGS

The invention, together with further objects and advantages thereof, may best be understood by making reference to the following description taken together with the accompanying drawings, in which.

DETAILED DESCRIPTION

In the drawings, corresponding reference numbers are used for similar or corresponding parts.

Figure 1:
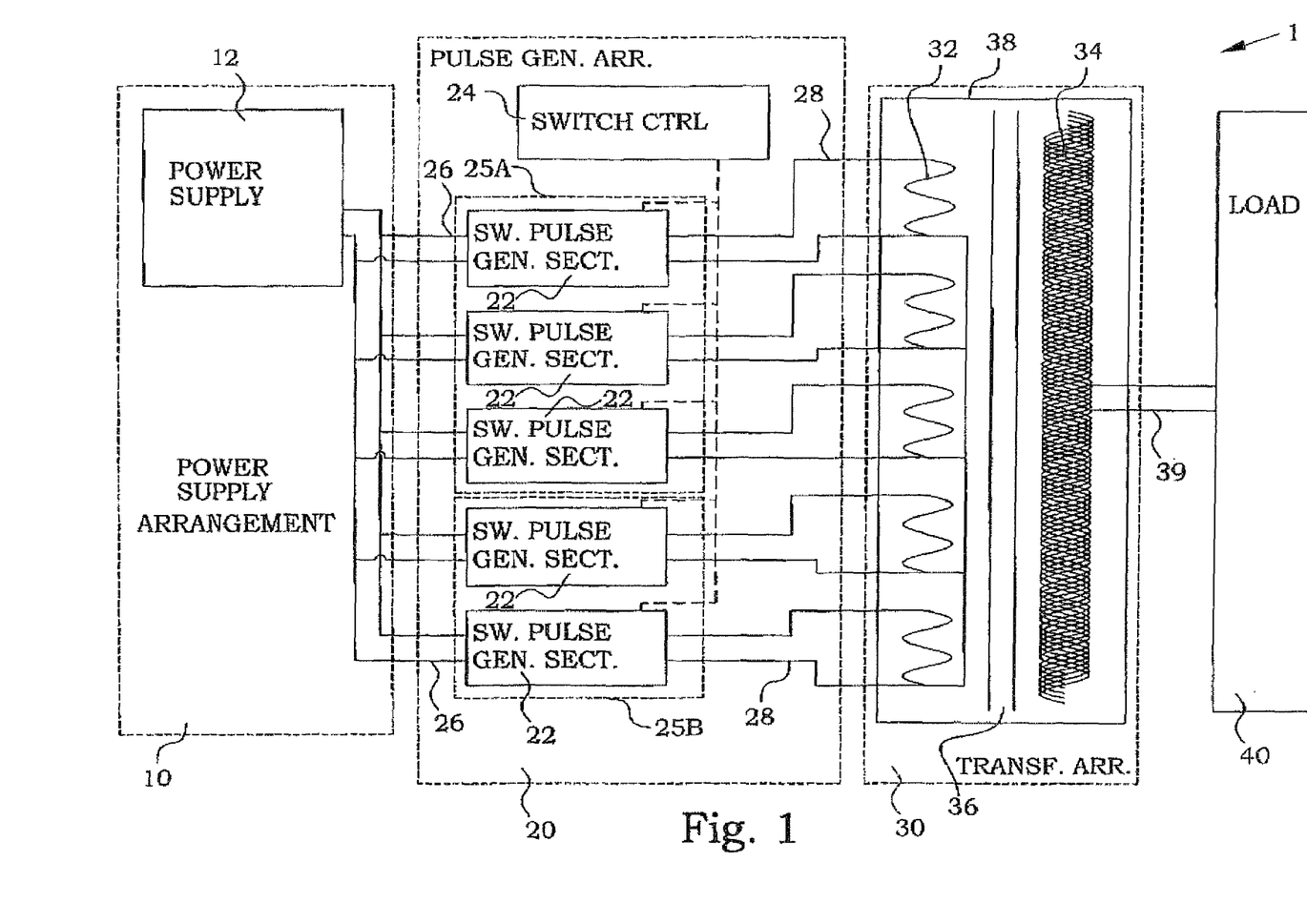
FIG. 1 is a block diagram of an embodiment of a power modulator according to the present invention.

FIG. 1 illustrates a general power modulator according to an embodiment of the present invention. A power modulator 1 comprises a pulse generator arrangement 20, having a plurality of switched pulse generator sections 22. A power supply arrangement 10 is connected to inputs 26 of the plurality of switched pulse generator sections 22 for supplying power thereto. The power supply arrangement 10 comprises one or several power supplies 12. A transformer arrangement 30 comprises in this embodiment one common transformer 38, having a primary side 32, a core 36, and a secondary side 34. The primary side 32 is connected to outputs 28 of the plurality of switched pulse generator sections 22. The transformer arrangement 30 has an output 39 connected to the secondary side 34 of the transformer arrangement 30. The output 39 is connected to a load 40 to be supplied with short high voltage pulses.

A switch control 24 is connected to the plurality of switched pulse generator sections 22 for providing of control signals for turning on and/or off the plurality of switched pulse generator sections 22. The switched pulse generator sections 22 are divided in different subsets 25A-B of switched pulse generator sections. The subsets are different, but may in certain embodiments at least partly overlap. The switch control 24 is arranged to provide control signals for turning on and/or turning off the switched pulse generator sections of the first subset 25A at a first time instant. Likewise, the switch control 24 is arranged to provide control signals for turning on and/or turning off the switched pulse generator sections of the second subset 25A at a second time instant, different from said first time instant.

The increased flexibility provided by an arrangement according to FIG. 1 can be visualized by considering a number of examples of applications of different embodiments of the present invention.

Figure 2:
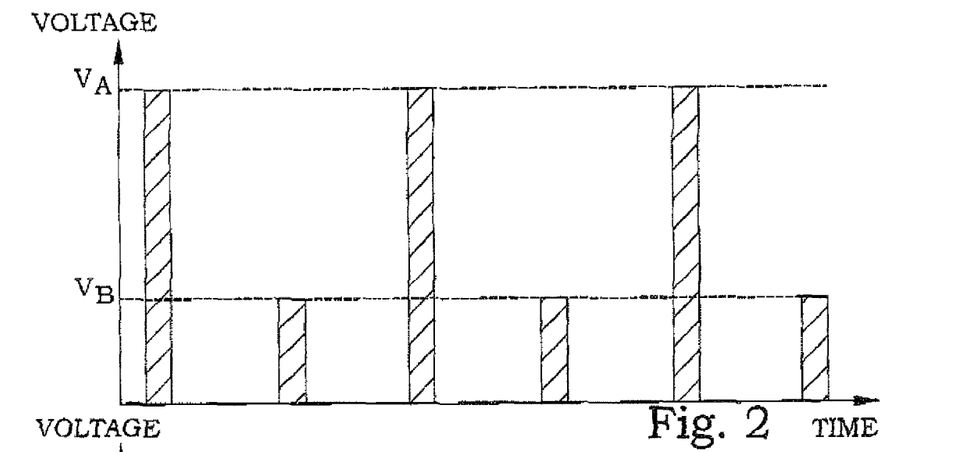
FIG. 2 is a diagram illustrating an example of voltage pulses with differing magnitudes.

In a first example, the assumed requirements are to provide a pulse train alternating between two distinct voltage amplitudes, $V_A$ and $V_B$, where $V_A > V_B$. The requested pulse train is illustrated in FIG. 2. In this example, it is assumed that $V_A$ is three times larger than $V_B$. However, anyone skilled in the art understands that any relation between the amplitudes can be achieved. Both voltages $V_A$ and $V_B$ are assumed to be positive.

Figure 3:
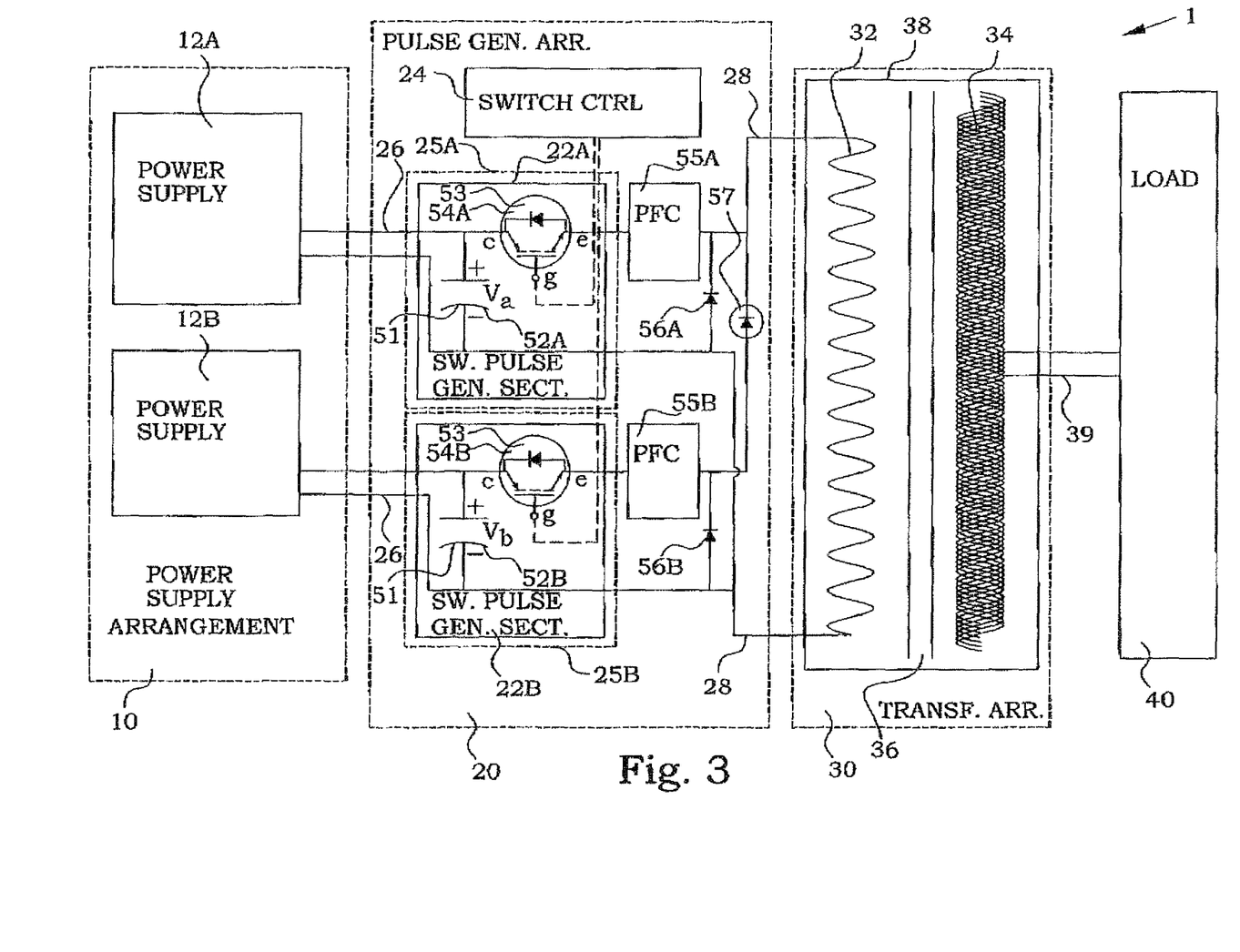
FIG. 3 is a block diagram of another embodiment of a power modulator according to the present invention.

FIG. 3 illustrates an embodiment of a circuit for achieving such required pulse train. In this embodiment, the required output voltages $V_A$, $V_B$ are requested to be 20 and 60 kV, respectively, the pulse duration 10 µs, and a pulse repetition rate of 500 Hz, and an average output of 6 kW. The instantaneous power in the pulses is thereby 1.2 MW. The basic blocks are easily seen. A power supply arrangement 10 comprises in this embodiment two power supplies 12A and 12B. Power supply 12A provides a DC voltage $V_a$, where the relation $V_A/V_a$ corresponds to the transformer ratio of the transformer arrangement 30, described further below. Similarly power supply 12B provides a DC voltage $V_b$, where the relation $V_B/V_b = V_A/V_a$. In the present embodiment the transformer ratio is 50:1, which calls for output voltages of the power supplies 12A, 12B of $V_a = 1200$ V and $V_b = 400$ V, respectively. The pulse generator arrangement 20 comprises in this embodiment two switched pulse generator sections 22A, 22B. The power supply 12A is connected to a switched pulse generator section 22A.

In this particular example, the switched pulse generator section 22A comprises an energy storage 51 constituted by a capacitor 52A. The capacitor 52A is charged by the power supply 12A to the voltage $V_a$. The switched pulse generator section 22A further comprises a switch 53, in this exemplary embodiment constituted by an IGBT (Insulated-Gate Bipolar Transistor) switch. The switch is turned on by supplying the gate electrode by a suitable voltage signal, i.e. a control pulse, and the switch is turned off by removing the voltage signal. Such a voltage signal is provided as a switch control signal provided by the switch control 24. The pulse generator arrangement 20 in the present exemplary embodiment further comprises a pulse-flattening circuit 55A connected to the emitter of the IGBT 54A for causing a voltage pulse with a constant amplitude. A diode 56A is provided between the negative pole of the capacitor 52A and the output from the pulse-flattening circuit 55A for protecting for voltage spikes, in particular in connection with switching off the pulse generator section 22A.

Other examples of power switches possible to be used include solid-state switches, MosFets or IGTCs (Insulated Gate-Controlled Thyristors), controllable at turn-on and/or turn-off. Both MosFets and IGTCs are controllable at both turn-on and turn-off, and this is the preferable case.

The switched pulse generator section 22B is in the present embodiment provided with corresponding parts. However, the capacitor 52B is instead charged by the power supply 12B to the voltage $V_b$. The switched pulse generator section 22B is furthermore provided with a blocking diode 57, connected in series between the output from the pulse-flattening circuit 55A and the transformer arrangement 30. The blocking diode 57 prohibits the diode built into the IGBT 54B from being forward-biased, which, would cause conduction of a very large current from the switched pulse generator section 22A when the IGBT 54A is triggered. The blocking diode 57 is not difficult to obtain. One choice is to use parallel diodes of the same type as used as the diodes 56A, 56B. For a current between 1000 and 2000 A, typically two or three well-cooled parallel diodes will be sufficient.

The outputs from the switched pulse generator sections 22A, 22B are connected in parallel to a primary winding 32 of a transformer 38 of the transformer arrangement 30. As mentioned above, the transformer provides an enhancement in voltage corresponding to the ratios $V_B/V_b=V_A/V_a$. The secondary winding 34 of the transformer 38 is connected to the load 40.

In the present embodiment, the switched pulse generator sections 22A and 22B are divided into two different subsets 25A-B, i.e. in the present embodiment subset 25A comprise the switched pulse generator sections 22A and subset 25B comprise the switched pulse generator sections 22B. The switch control 24 is arranged to alternatingly switch on the IGBT 54A and the IGBT 54B. The result will be that the primary winding 32 of the transformer 38 will experience pulses of alternating amplitudes, which are transformed into alternating voltage amplitude pulses supplied to the load 40.

In a typical case, less than 10% of the energy stored in the capacitors 52A, 52B is released in each pulse. In other words, 90% of the energy remains in the capacitors 52A, 52B immediately after a pulse is ended. If one and the same pulse generator section would be utilized for providing different output voltages, the voltage over the capacitors has to be changed accordingly. If the voltage is to be increased, the time for charging the capacitor to the right voltage has to be available, which is mainly determined by the resistance in the supply lines. More troublesome is the situation if the voltage for the next pulse is lower. In such a case, the storing capacitor has to be allowed to empty part of its energy content before the new pulse. Since the amount of energy that is stored typically is quite large, such arrangements are not trivial to achieve. Overall, a large amount of energy has to be dumped which makes the allover energy efficiency very poor.

By instead, according to the present invention, utilizing two separate pulse generator sections, any change in voltage becomes unnecessary and the energy stored in the capacitors can be saved to create a next pulse of the same voltage instead. The overall energy consumption will thereby be much smaller. To that end, the switch control 24 is arranged to provide control signals for turning on and preferably also turning off the switched pulse generator section 22A of the first subset 25A of an available plurality of switched pulse generator sections at a first time instant. The switch control 24 is furthermore arranged to provide control signals far turning on and preferably also turning off the switched pulse generator section 22B of the second subset 25B at a second time instant. The second time instant is different from the first time instant.

Figure 4A:
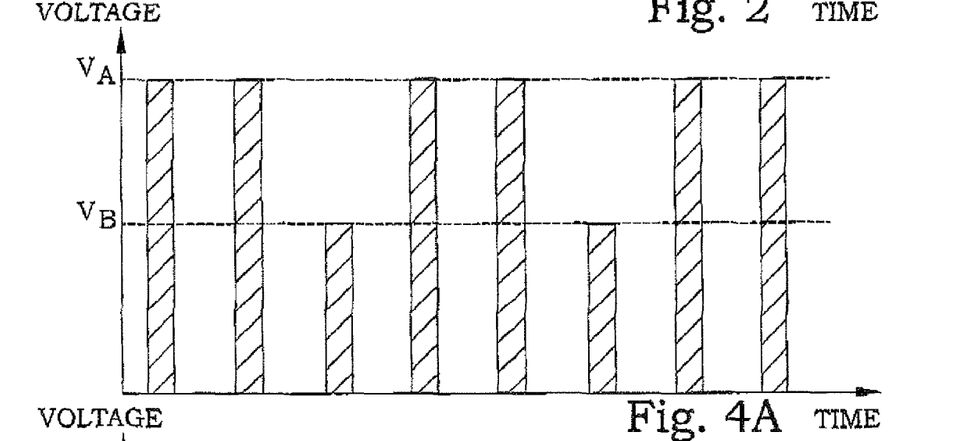
FIGS. 4A-E are diagrams illustrating other examples of voltage pulses with differing magnitudes.
Figure 4B:
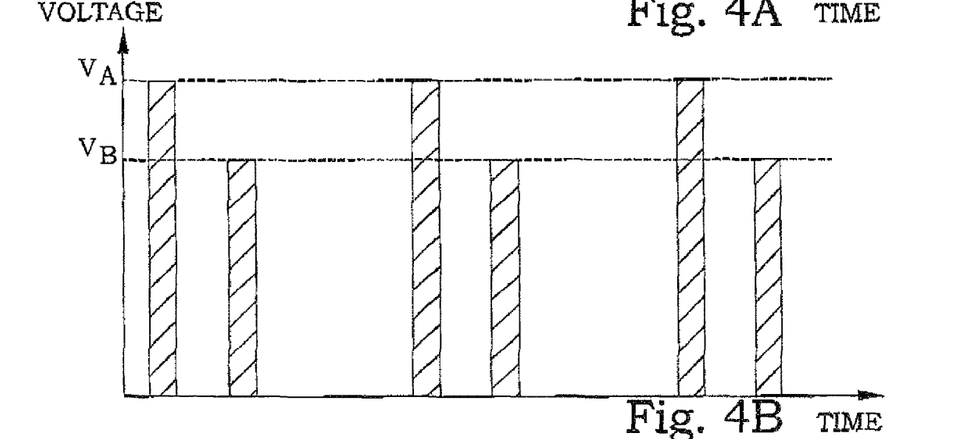
Figure 4C:
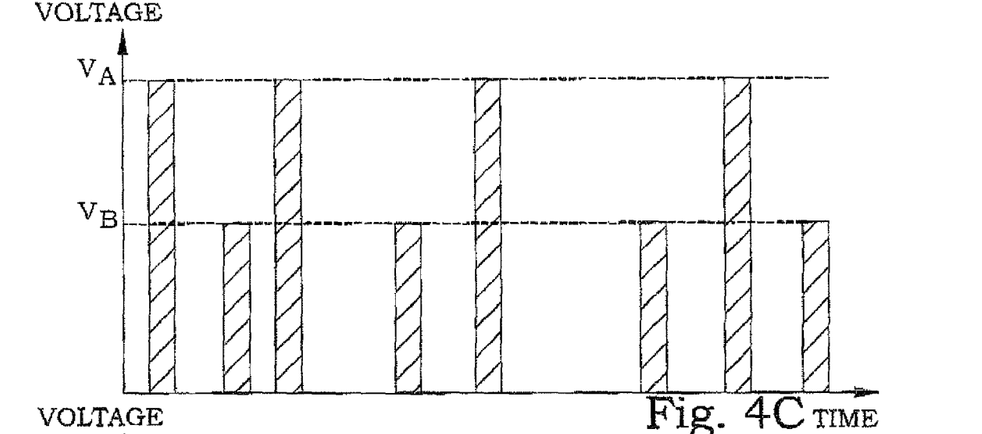
Figure 4D:
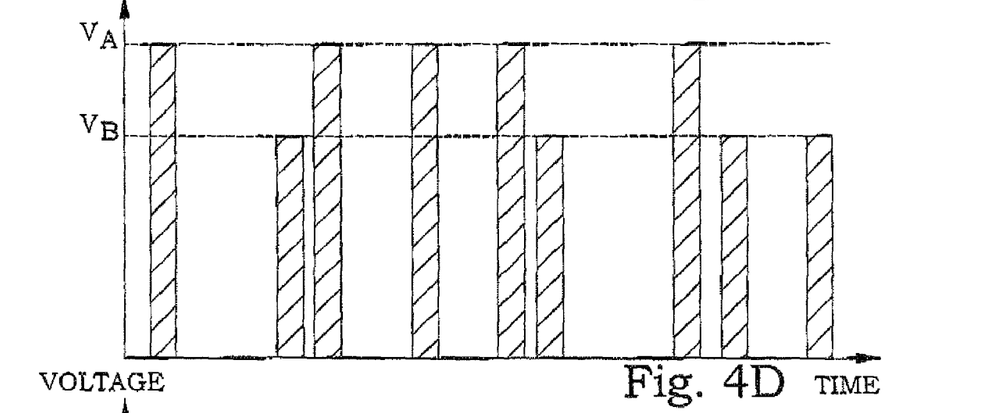

The configuration of FIG. 3 can also be used for producing other pulse trains as well. Any combination of pulses of amplitude $V_A$ and $V_B$ can be provided if capacities of voltage supplies diodes etc. are designed accordingly. In FIGS. 4A-D, some non-exclusive examples are given. In FIG. 4A, a regular pattern of two pulses of amplitude $V_B$ and one pulse of amplitude $V_A$ is achieved by turning on the switched pulse generator section 22B two times in a row and then the switched pulse generator section 22A one time and repeating that operation. In FIG. 4B, the voltages $V_A$ and $V_B$ axe provided alternatingly, but with different time difference to the preceding pulse. In FIG. 4C, the voltages $V_A$ and $V_B$ are also provided alternatingly, but now with irregular time spacing. This is obtained as long as two consecutive pulses of the same amplitude differ in time more than a recovery time of the corresponding switched pulse generator section. In FIG. 4D, the pulse pattern is completely irregular, both in order of the two amplitudes and in the timing of the pulses.

Figure 4E:
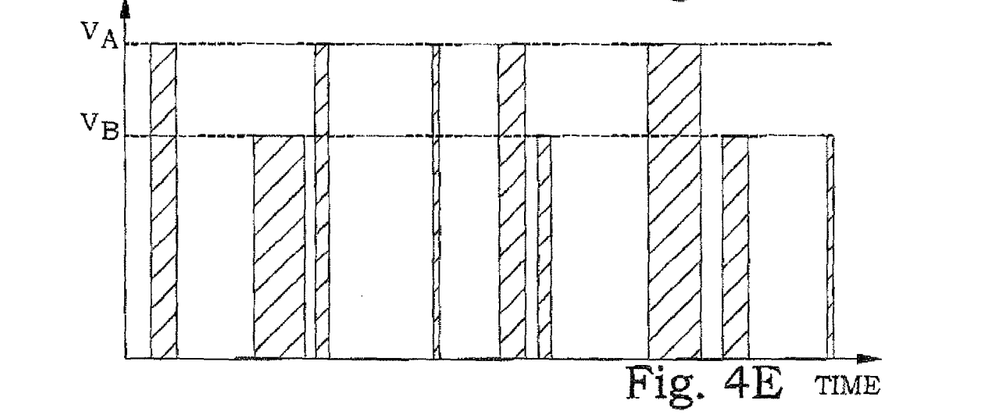

The illustrated examples of pulses have the same pulse duration for each pulse. However, if the turn-off of the switched pulse generator sections 22A, B is controllable, also the duration of the pulses can be varied, regularly or irregularly. Anyone skilled in the art realizes that the possible variations are practically unlimited. One example of a possible pulse is illustrated in FIG. 4E.

Figure 5:
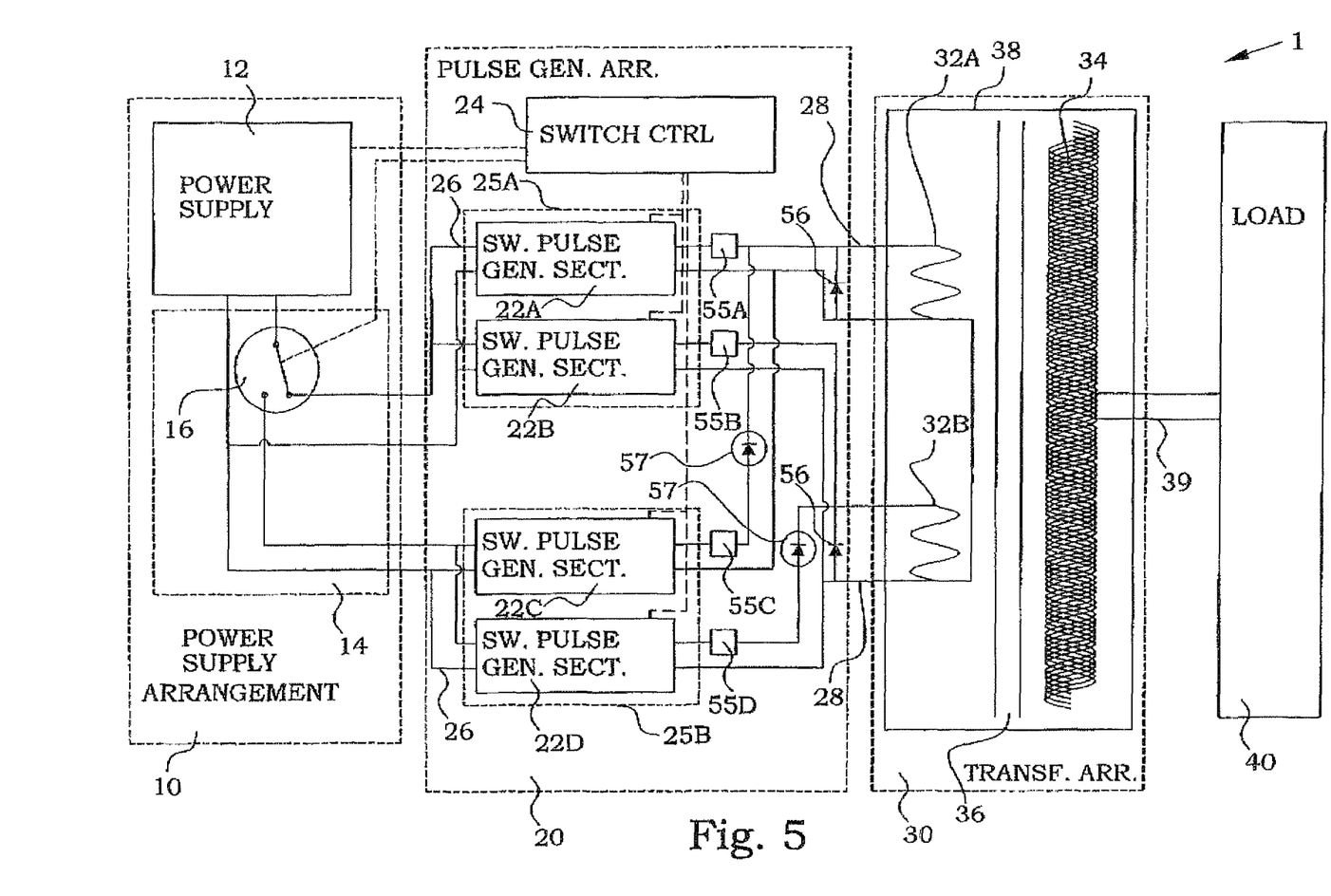
FIG. 5 is a block diagram of yet another embodiment of a power modulator according to the present invention.

In FIG. 5, an alternative embodiment to FIG. 3 is illustrated. Similar parts as in FIG. 3 will not be discussed again. In this embodiment, the power supply arrangement 10 comprises only one power supply unit 12, which is connected to four separate switched pulse generator sections 22A-D via a connection arrangement 14. This might be a good solution if the total power is sufficiently low to be handled by one single power supply. The connection arrangement 14 enables connection of the power supply unit 12 to more than one switched pulse generator section 22A-D. The connection arrangement 14 further comprises a switch 16 for enabling connection and disconnection of selected switched pulse generator sections. The switch 16 is in the present embodiment controlled by the switch control 24, to connect the switched pulse generator sections that are planned to be turned on for producing the next pulse. The switch control 24 also controls the output voltage of the power supply unit 12 to be in accordance with the intended voltage of the next pulse.

The four switched pulse generator sections 22A-D are divided into two subsets 25A and 25B, each one configured to provide a certain output voltage. To this end, the switched pulse generator sections 22A and 22B in the present exemplary embodiment are arranged to turn on simultaneously and turn off simultaneously, as controlled by the switch control 24. Likewise, the switched pulse generator sections 22C and 22D are arranged to turn on simultaneously and turn off simultaneously, as also controlled by the switch control 24. The subset 25B is in this embodiment provided with a blocking diode 57 for each switched pulse generator section 22C and 22D of the second subset 25B. The transformer 38 is provided with two separately connectable primary side windings 32A and 32B. The windings 32A and 32B are thereby electrically separate but magnetically coupled. In this embodiment, one switched pulse generator section 22A and 22C from each subset is connected to the first winding 32A and one switched pulse generator section 22B and 22D from each subset is connected to the first winding 32B. A common diode 56 for each winding is also provided for protecting the respective connected switched pulse generator sections against spikes.

The principles presented above may of course be generalized in that there may any number of switched pulse generator sections divided in any number of subsets. In a typical configuration, the subsets are complementary, e.g. each switched pulse generator section belongs only to one subset. However, depending on the application, there might be situations, where subsets may overlap, i.e. a single switched pulse generator section may belong to more than one subset. The subsets are, however, not identical. Different subsets may also comprise different numbers of switched pulse generator sections.

From the above described generalized configurations of subsets, it also becomes evident that other types of pulse trains are possible to achieve. For instance, three subsets can be configured to supply different voltages and thereby give output pulses of three different magnitudes. This can of course be generalized into any number of voltage levels.

Figure 6:
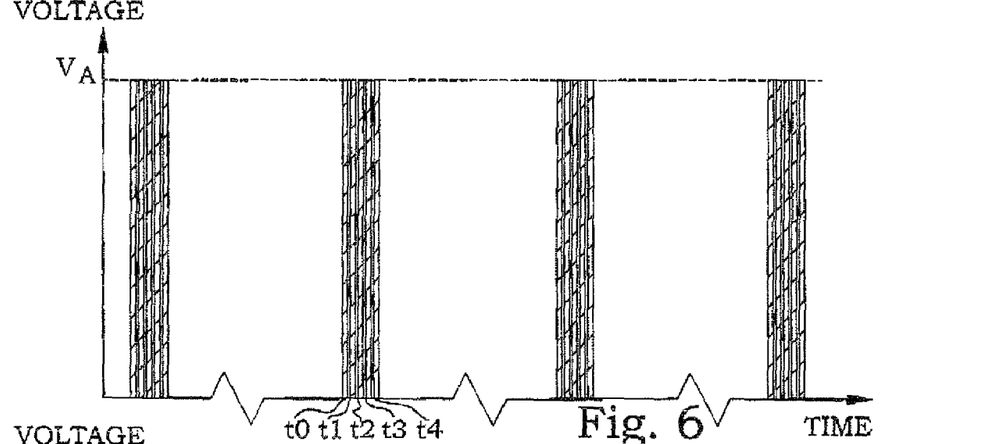
FIG. 6 is a diagram illustrating an example of voltage pulse bursts.

In a second example of requirements for a pulse output, a pulse burst is requested. In a particular embodiment, the requested output of which is illustrated in FIG. 6, bursts of five pulses are requested. The pulse duration is very short and so is the period between the pulses of each burst. The voltages of each pulse in the burst are however essentially the same. A typical, but not limiting, time period between the pulses of each burst can be in the order of a few microseconds, while the time period between consecutive bursts may be in the order milliseconds. Such bursts could e.g. be requested in radar applications. The main difficulty in such applications is that the extremely short time between the pulses typically is much shorter than a recovery time of a switched pulse generator section.

Figure 7:
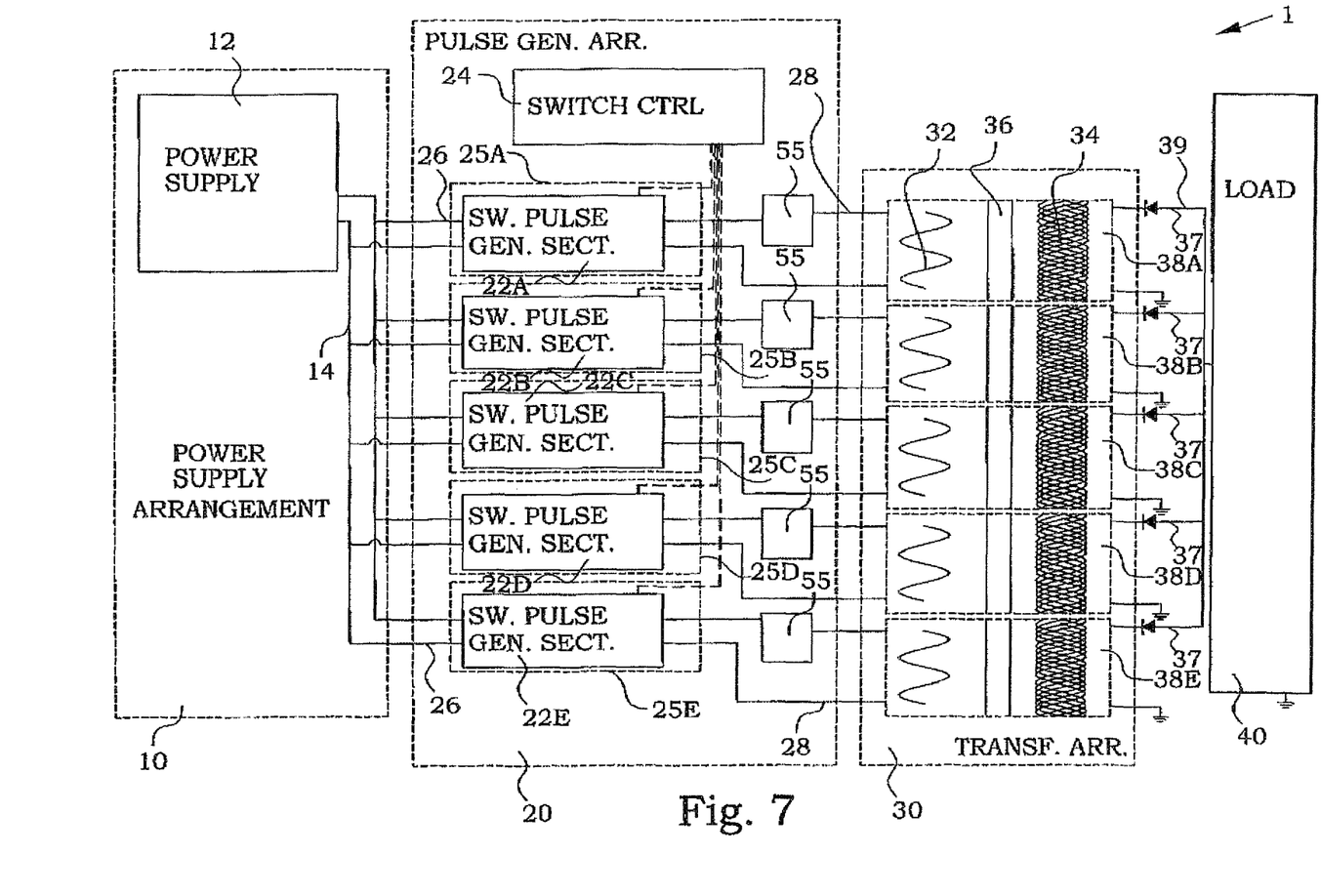
FIG. 7 is a block diagram of yet another embodiment of a power modulator according to the present invention.

FIG. 7 illustrates an exemplary embodiment of a power modulator being able to provide such pulse bursts. In the present embodiment, the duration of each burst is 4 µs, and the time between the end of one pulse and a next pulse in the same burst is 2 µs, i.e. the repetition rate within the burst is 167 kHz. The burst repetition rate is 400 Hz, which gives a time difference between two consecutive burst starts of 2.5 ms. Note that the time scale in FIG. 6 is not linear over the entire illustrated range. An output pulse power of 50 kW and an output pulse voltage of 100 kV are provided. A single power supply unit 12 provides a same voltage to five switched pulse generator sections 22A-E of a pulse generator arrangement 20. Each of the switched pulse generator sections 22A-E form their own subset 25A-E in this exemplary embodiment. Since all switched pulse generator sections 22A-E are intended to operate at the same voltage, no switches are necessary in the connection arrangement 14. Alternatively, the different switched pulse generator sections 22A-E could be connected to one power supply unit each or in different groups to a number of power supply units.

The transformer arrangement 30 comprises in this embodiment five transformers 38A-E, each one connected to the outputs of the switched pulse generator sections 22A-E of a respective subset 25A-E. The outputs from the switched pulse generator sections 22A-E are connected to the transformers 38A-E via separate pulse-flattening circuits 55. Depending on the application, if the flatness of the pulses is not of crucial importance, the pulse-flattening circuits 55 may be omitted. The load 40 is connected to the secondary side 34 of the transformers 38A-F via diode strings 37. The switch control 24 is in this embodiment arranged for supplying switched pulse generator sections 22A-E with separate turning-on and turning-off signals, separated by the intended pulse separation time. For instance, if the switched pulse generator section 22A is turned on at time t0, the switched pulse generator section 22B is turned on at time t1, the switched pulse generator section 22C is turned on at time t2, the switched pulse generator section 22D is turned on at time t3, and the switched pulse generator section 22E is turned on at time t4. A pulse burst as in FIG. 6 will then be produced.

This exemplary embodiment can thus generate very closely spaced pulses, even though the power supply cannot recharge the modules fast enough to make these pulses with only a single module or a single subset of modules. The same ideas can of course be realized with more than one switched pulse generator section in each subset. Each subset of modules with its power supply can be viewed as forming a separate modulator system of its own, and never needs to interact with the other sets of modules. However, the subsets may share parts of the system, such as transformer parts, pulse-shaping parts, protecting diodes, power supply arrangement and so forth.

If the use of multiple power supply units is called for, means to use multiphase input power transformers to reduce powerline disturbances and harmonics and simplify the soft-start and line filter hardware may be necessary. However, such solutions are as such known in prior art and are not of a primary importance for understanding the basic ideas of the present invention.

Figure 8A:
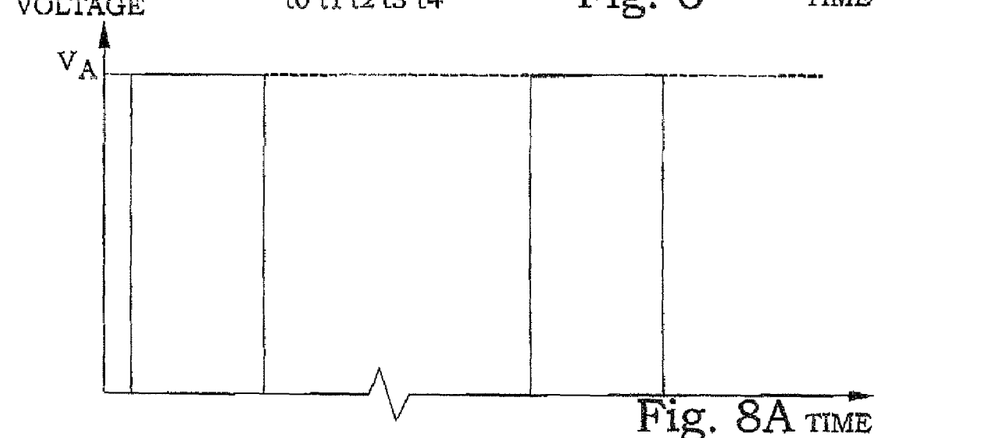
FIGS. 8A-B are diagrams illustrating examples of long voltage pulses.

In a third example of requirements for a pulse output, a long pulse duration is requested. In a particular embodiment, the requested output of which is illustrated in FIG. 8A, a pulse of 140 kV, 14 MW of duration of 250 microseconds is requested with a repetition rate of 160 Hz. This gives an average power of 560 kW. In such a case, the pulse power is possible to obtain with techniques available today, however, typical pulse generators cannot withhold such a power for such a long time.

Figure 9:
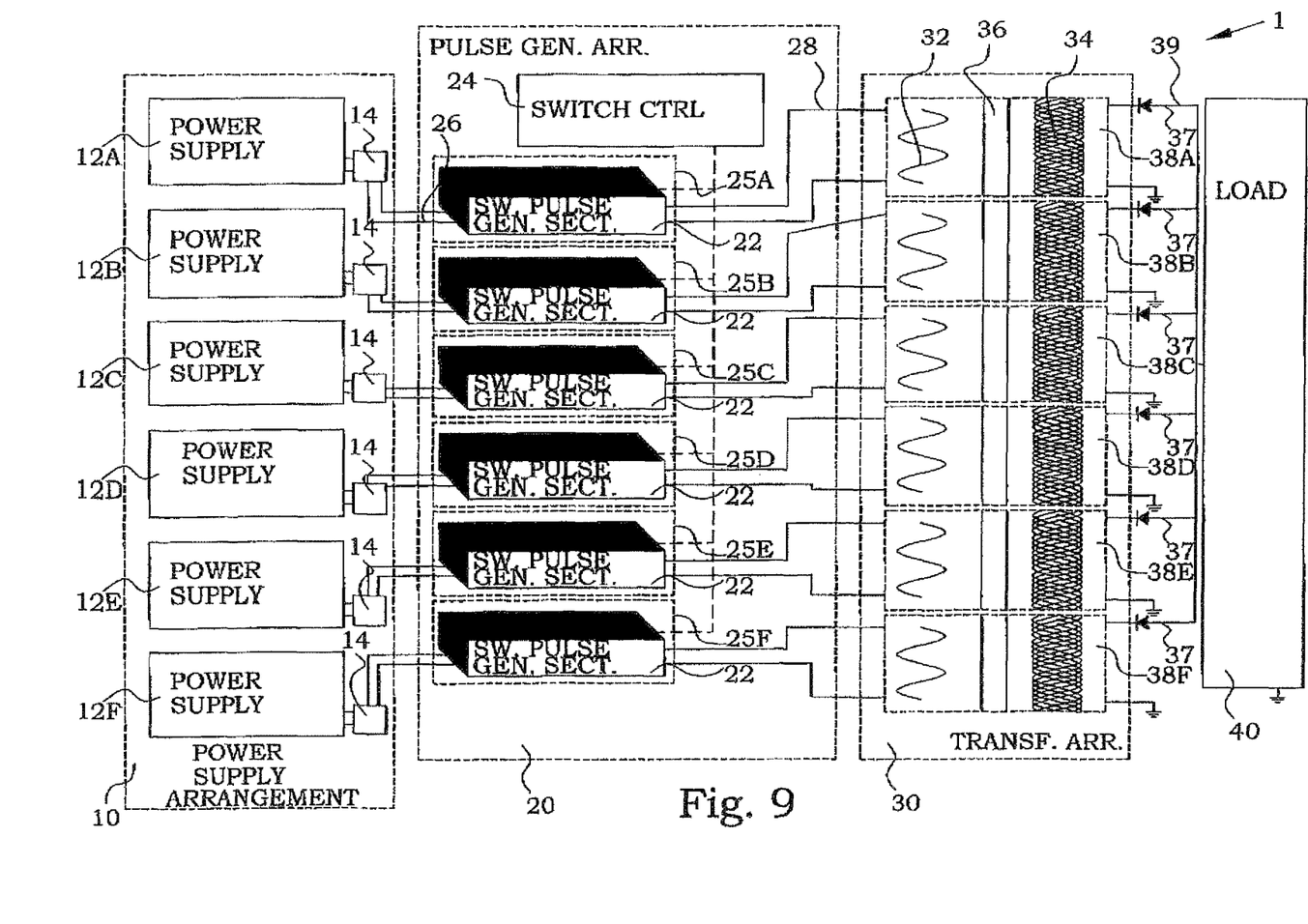
FIG. 9 is a block diagram of yet another embodiment of a power modulator according to the present invention.

FIG. 9 illustrates an embodiment of a power modulator being able to provide such long pulses. The embodiment has similarities with the embodiment presented in FIG. 7 and the embodiments can be modified to be utilized either for pulse bursts or long pulses depending on power and duration requests. In the present embodiment, the power supply arrangement 10 comprises six power supplies 12A-F comprising power-factor correction and energy storage circuits. Each power supply 12A-F is in the present embodiment capable of delivering a peak power of about 3 MW at a voltage of 1000 V. The connection arrangement 14 comprises in this embodiment high-speed recharging circuitry for connecting the inputs 26 of the switched pulse generator sections 22.

The pulse generator arrangement 20 comprises in this embodiment 144 switched pulse generator sections 22, grouped in six subsets 25A-F with 24 switched pulse generator sections 22 in each. In this example, the switched pulse generator sections 22 are based on IGBT switches and are possible to electronically control both at turn-on and turn-off. The optional arrangements for pulse-flattening and spike protection are omitted in the figure to increase the readability.

The transformer arrangement 30 comprises in this embodiment six transformers 38A-F, each one connected to the outputs of the switched pulse generator sections 22 of a respective subset 25A-F. The transformers 38A-F transform the 1000 V pulses of the primary side 32 to the requested 140 kV pulses of the secondary side 34. The load 40 is connected to the secondary side 34 of the transformers 38A-F via 200 kV diode strings 37.

In the present embodiment, each switched pulse generator section 22 is based on a 94 µF capacitor charged to 1 kV by the power supply arrangement. When discharging the capacitor, the voltage will droop. This droop can be compensated by droop compensation circuits within certain limits. Typically, a voltage droop of 10 percent is acceptable. Each switched pulse generator section 22 can therefore in the present embodiment contribute 8.75 J in each discharging step, which in the present embodiment is 15 µs long. Totally, from one subset, a 15 µs long pulse adds up to 24×8.75 J=210 J, i.e. 14 MW. Thus, one subset 25A-F can give a 15 µs long pulse of the requested power and voltage.

In order to achieve the requested pulse duration of the 250 µs, the grouping of the switched pulse generator sections 22 into subsets 25A-F are used together with the property of having a well-controlled electronic turn-on and turn-off. In the present embodiment, the feature of the switch solution, e.g. by IGBT switched, to have also a well controlled turn-off of the switched pulse generator sections 22 is of importance. The switch control 24 is in the present embodiment arranged to turn on switched pulse generator sections 22 of a first subset 25A for 15 µs. At the same time as the switch control 24 turns off the switched pulse generator sections 22 of the first subset 25A, the switched pulse generator sections 22 of the first subset 25B are turned on for an additional 15 µs. This is then repeated until all six subsets 25A-F have contributed with 15 µs each, i.e. totally 90 µs.

Figure 8B:
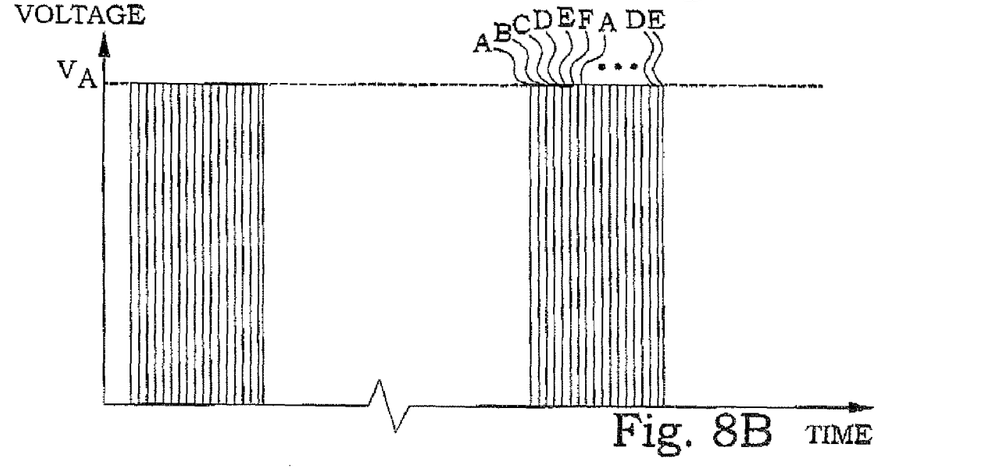

When the switched pulse generator sections 22 of the first subset 25A are turned off, the high-speed recharging circuitry of the connecting arrangement 14 allows for a recovering of the switched pulse generator sections 22. Totally 210 J have to be supplied to the switched pulse generator sections 22 within the first subset 25A. Since the power supply 12A allows for delivering a power of about 3 MW at a voltage of 1000 V, the recovery time of the switched pulse generator sections 22 within the first subset 25A can be made shorter than 75 µs. In other words, the switched pulse generator sections 22 within the first subset 25A are ready for a new discharging operation already when the sixth subset 25F ends its power distribution 90 µs after the start. This means that the switched pulse generator sections 22 within the first subset 25A can be turned on simultaneously to the turn-off of the switched pulse generator sections 22 within the sixth subset 25F, and the procedure can be repeated. By letting the first four subsets 25A-D to operate four times each, the sixth subset 25F two times and the fifth subset 25E two full times and a final time of a limited duration of 10 µs, a total pulse of 3×4×15 µs+2×2×15 µs+10 µs=250 µs is achieved. To make the 250 µs pulse, one subset of pulse generators must add another 10 µs to the end of the above pulse sequence. This is easily done, as the switches can be electronically commanded to turn of and off at any time. All this is possible by appropriately controlling the time instances for switching on and off the switched pulse generator sections 22, as performed by the switch control 24. The 250 µs pulse is thus composed by shorter pulses from the different subsets controlled to exactly fit to each other. This is illustrated in FIG. 8B, where the different letters indicates the individual pulses from the respective subsets. The procedure is then repeated with a repetition rate of 160 Hz to gives the average power of 560 kW.

Figure 10A:
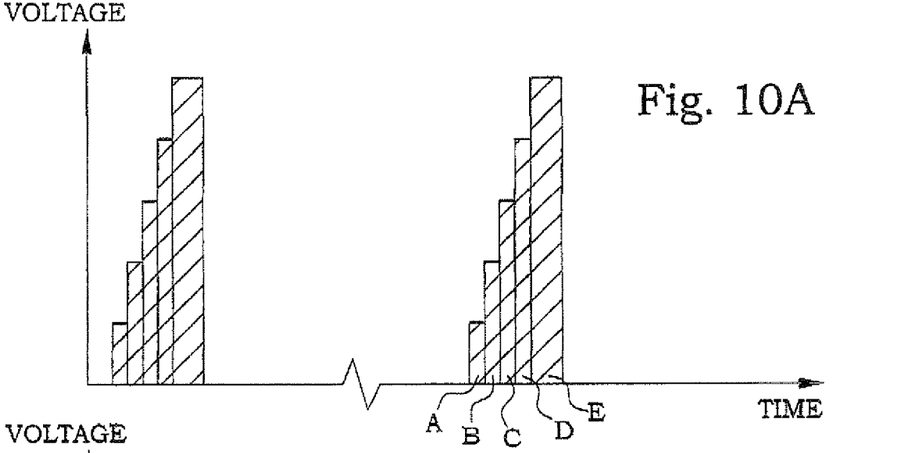
FIGS. 10A-C are diagrams illustrating examples of voltage pulses of non-constant magnitudes.
Figure 10B:
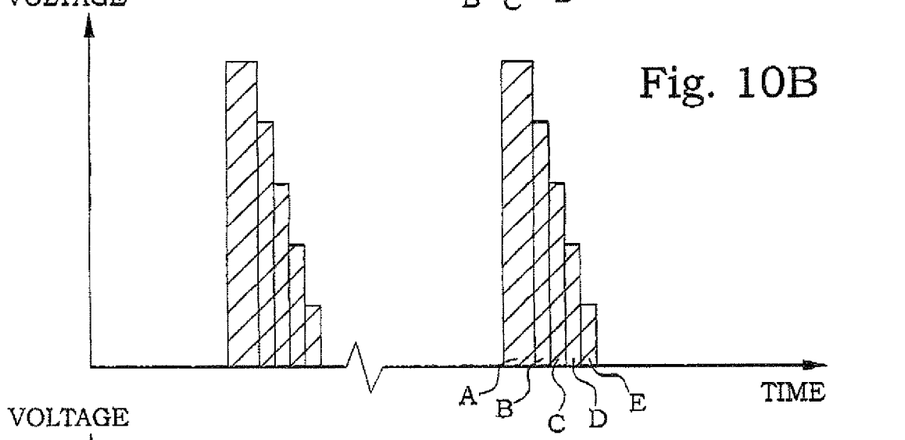
Figure 10C:
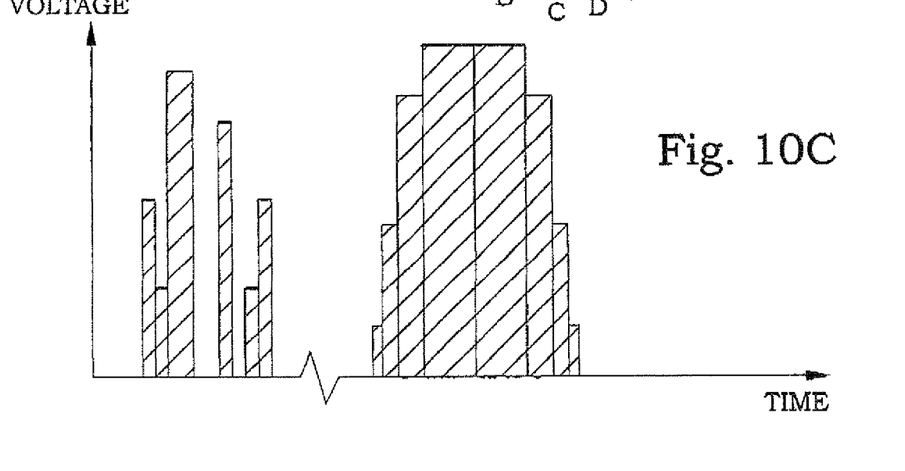

The idea of providing a long pulse by combining a number of shorter pulses also opens up the potential to create a pulse whose voltage varies controllably with time. FIG. 10A illustrates a voltage pulse, which starts at a relatively low voltage and successively builds up to a maximum value. This is achieved by connecting subgroups of switched pulse generator sections with successively increasing output voltage in a well controlled manner. In this particular example, at least five subgroups are used, since the total pulse is composed by five different voltage levels. FIGS. 10B and 10C illustrate non-exclusive examples of other pulse shape that can be obtained by the same type of arrangements.

Figure 11:
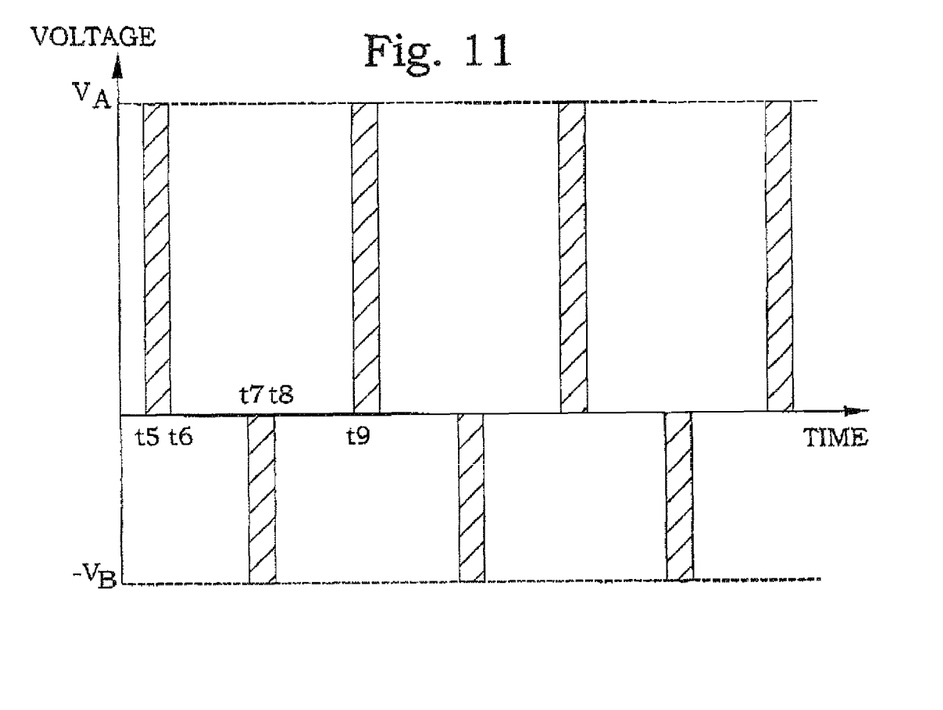
FIG. 11 is a diagram illustrating an example of voltage pulses with differing polarity.
Figure 12:
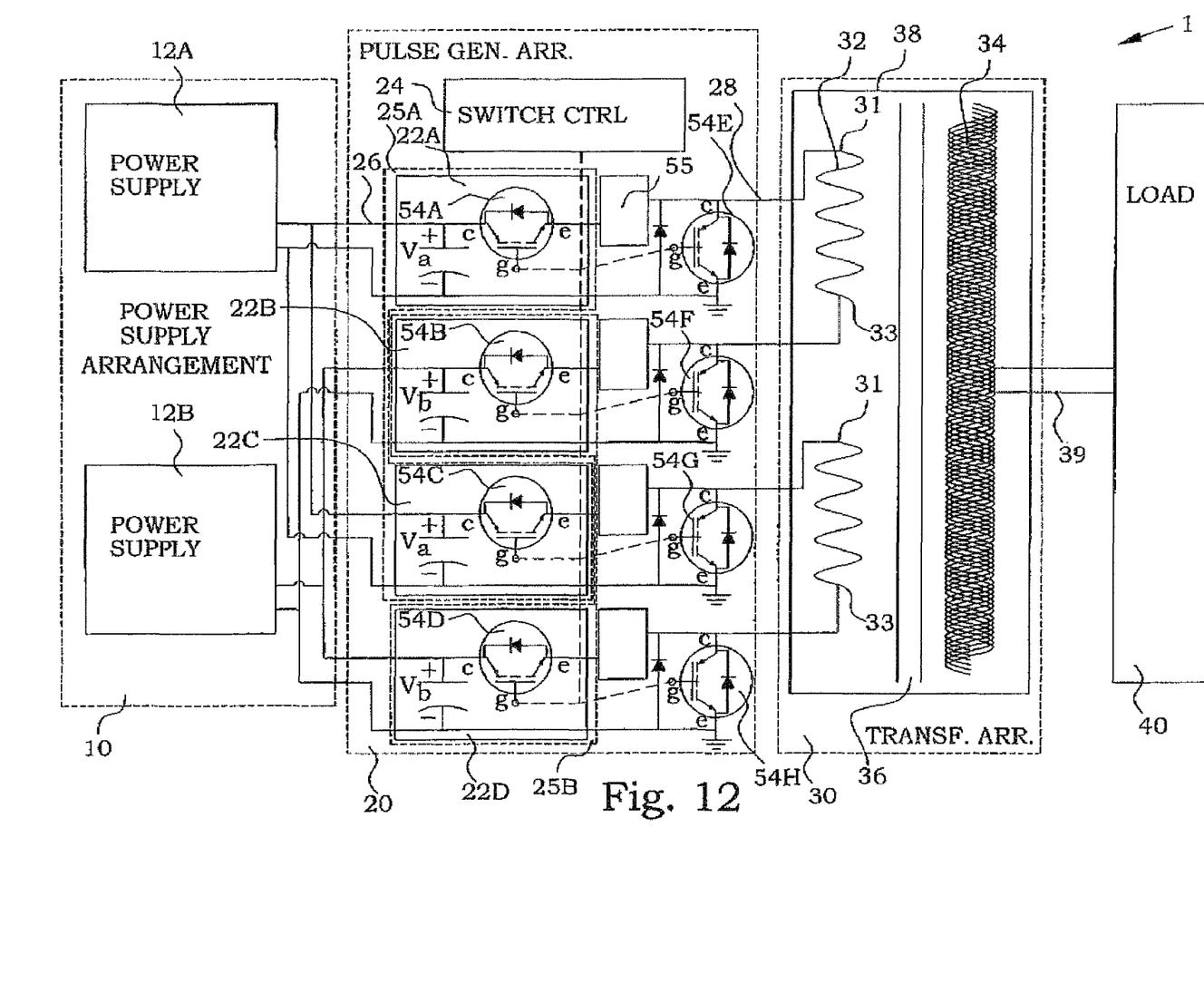
FIG. 12 is a block diagram of yet another embodiment of a power modulator according to the present invention.

In a fourth example of requirements for a pulse output, pulses of alternating polarity are requested. In a particular embodiment, the requested output of which is illustrated in FIG. 11, bipolar pulses are requested, i.e. positive pulses interleaved with negative pulses. To that end, a bridge circuit involving switched pulse generator sections is utilized. FIG. 12 illustrates an embodiment of a power modulator being able to provide such bipolar pulses. In this embodiment, four switched pulse generator sections 22A-D are divided into two subsets 25A-B. In the present embodiment, for each of the switched pulse generator sections 22A-D an IGBT switch 54E-H is connected on the output in order to allow a selective grounding of the output. The switched pulse generator sections 22A, C of the first subset 25A are connected to a first end 31 of a respective primary winding 32 of the transformer 38. Likewise, the switched pulse generator sections 22B, D of the second subset 25B are connected to a second end 33 of a respective primary winding 32 of the transformer 38. Some reference numbers, which are in common with earlier embodiments, are omitted in order to increase the readability of the figure. The IGBT switches 54E-H are also controllable by the switch control 24.

The operation can be described as follows. At the time the first, positive pulse is to start, t5 (FIG. 11), the IGBT switches 54A and 54C in the first subset 25A are turned on. A positive voltage is now provided onto the first end 31 of the primary windings 32. Simultaneously, the IGBT switches 54F and 54H are turned on in order to connect the second end 33 of the primary windings 32 to ground. At turn off, at time t6 (FIG. 11), the IGBT switches 54A and 54C are first switched off, and a short while afterwards, typically a few microseconds, the IGBT switches 54F and 54H are turned off. This is done to allow turn-off transient voltages and currents to die away without damaging the IGBT switches 54A and 54C. At the time the second, negative pulse is to start, t7 (FIG. 11), the IGBT switches 54B and 54D in the second subset 25B are turned on. A positive voltage is now provided onto the second end 33 of the primary windings 32. Simultaneously, the IGBT switches 54E and 54G are turned on in order to connect the first end 31 of the primary windings 32 to ground. This applies the opposite polarity of voltage to the transformer primary windings 32. After the pulse duration, at t8 (FIG. 11), the IGBT switches 54B and 54D are first switched off, and a short while afterwards, the IGBT switches 54E and 54G are turned off. The cycle repeats at time t9 (FIG. 11). As in the case of the embodiments for application of positive pulses of different magnitudes, the times for turn on and turn off as well as the duration can be varied in any combination, c.f. FIGS. 4A-E and discussions thereabout.

If the power modulator is intended for powering e.g. a klystron or other e-gun type, one has to consider that the load has a voltage-dependent impedance. If normally a maximum power is provided, a particular impedance is experienced. If a power lower than the maximum is provided, the impedance is different. Since the networks of power modulators often are tuned to a particular impedance, such scenarios can be troublesome in some occasions.

In the concepts presented in the present disclosure, voltage-dependent impedance is however rather easily handled. By synchronizing a number of switched pulse generator sections in a subgroup to provide a voltage pulse, a flexibility in pulse-shaping is built in. When providing a first high-voltage pulse to a klystron, a subgroup involving certain number of switched pulse generator sections can be used. When instead providing a somewhat lower voltage pulse to the klystron, another subgroup involving a lower number of switched pulse generator sections can be used. The load impedance will be higher than at the first voltage, and the higher output impedance of the section's pulse-shaping circuit with less number of switched pulse generator sections operating will match the new load well enough to maintain a correct flatness and overshoot on the load voltage pulse. If there are arrangements and time for changing the output voltage of the switched pulse generator sections, the subgroups may overlap, otherwise non-overlapping subgroups have to be used.

Most klystron and Twystron tubes draw a space-charge limited current in which the current varies as the 3/2 power of the voltage. So the ratio of V/I, the load impedance, varies as the inverse square root of the voltage. For example, if the voltage is reduced to half the maximum, the load impedance will rise to 1.414 times its value at full voltage. So to match this new impedance., one should operate only 1/1.414=0.707 or 70 per cent of the switched pulse generator sections compared to the situation at maximum. If three switched pulse generator sections are used at maximum voltage, it would be appropriate to operate with two switched pulse generator sections at half voltage (67%). An embodiment of a power modulator according to FIG. 1 will e.g. be possible to use in the case there are no arrangements for changing the output voltage of the switched pulse generator sections. However, an arrangement for charging the switched pulse generator sections of the second subgroup 25B to a lower voltage has to be provided for.

Figure 13:
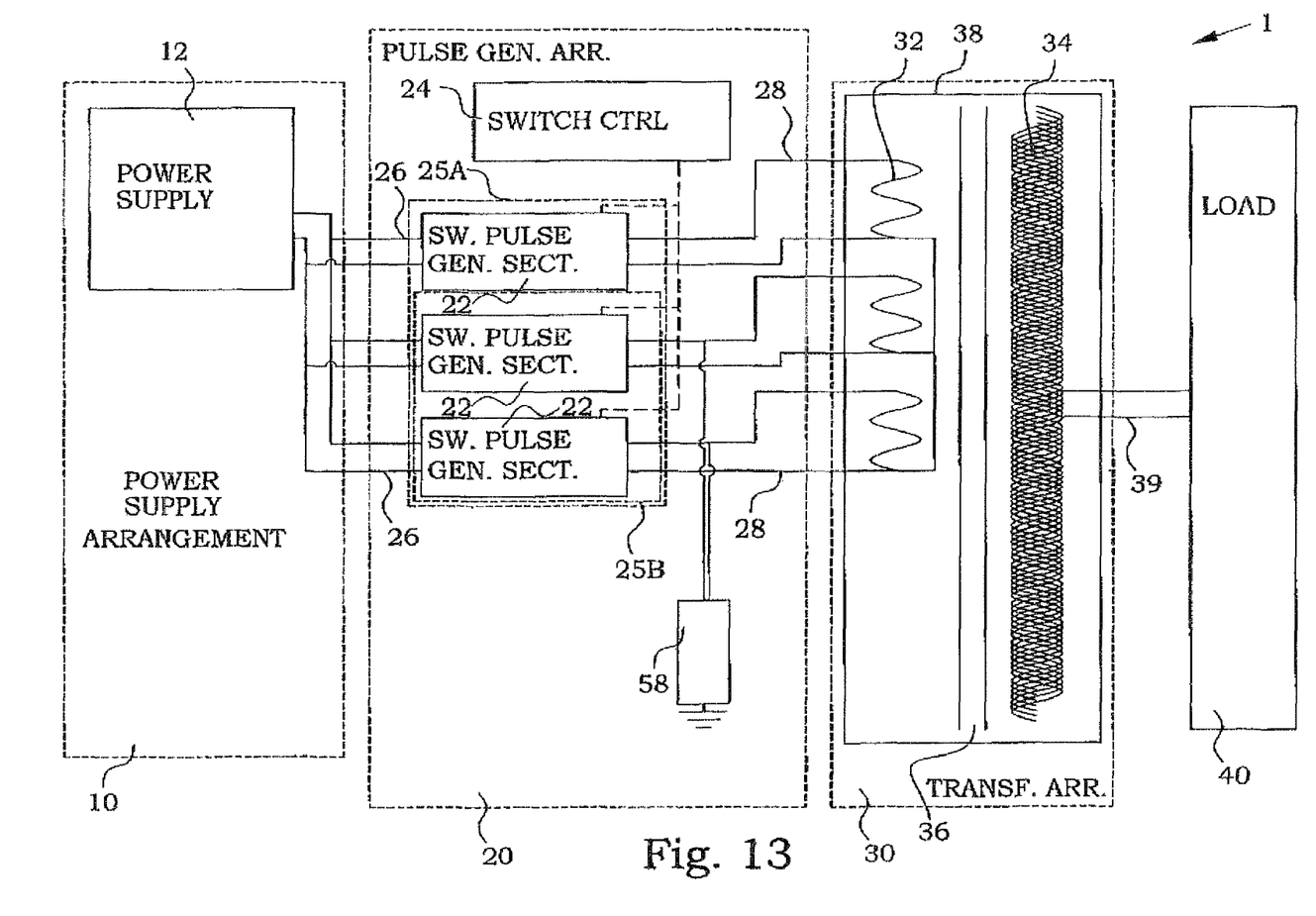
FIG. 13 is a block diagram of yet another embodiment of a power modulator according to the present invention.

In FIG. 13, an embodiment of a power modulator in which there is enough time for changing the output voltage of the switched pulse generator sections between the two output voltages is presented. Here, the load 40 is assumed to be of a klystron type. In this embodiment, the first subgroup 25A and the second subgroup 25B have two switched pulse generator sections in common. When a maximum voltage pulse is to be provided, subgroup 25A is used, and the power supply 12 is controlled by the switch control 24 to provide a suitable voltage. When changing to a pulse voltage of half the maximum value, the switched pulse generator sections 22 of the second subgroup 25B are allowed to discharge some of its charge through a dumping circuit 58. When the lower voltage pulse then is to be provided, the second subgroup 25B is used to deliver the pulse.

Note furthermore that this is conservative from the current and power-handling point of view. At half voltage, the current is reduced by more than half, i.e. to about 35% of the full-voltage value. So despite the lower number of switched pulse generator sections, each switched pulse generator section would be switching less current than at full power. In figures, each one is switching only about half the current that it would at full power. This means the reduced number of switched pulse generator sections is acceptable from e.g. a heating standpoint. The switched pulse generator sections will run much cooler than at full power.

In most applications today, a "well-shaped" pulse with abrupt leading and ending flanks and an essentially flat top is desired. However, the possibility to adapt the impedance on the primary side of the transformer also opens up for providing pulses of other shapes. By turning on switched pulse generator sections during the operation of other switched pulse generator sections and/or by turning off some switched pulse generator sections while others are allowed to continue to operate will create pulses with complex shapes due to the change in impedance following the turning on and/or turning off.

Figure 14:
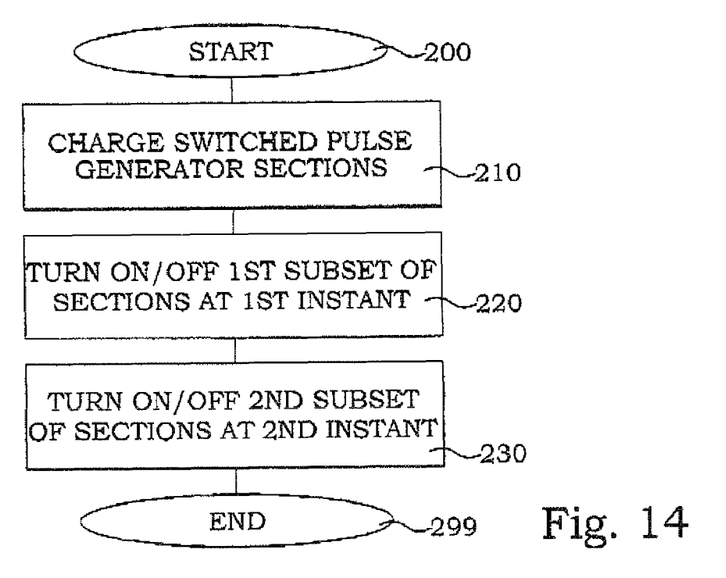
FIG. 14 is a flow diagram of an embodiment of a method according to the present invention.

FIG. 14 illustrates a flow diagram of steps of an embodiment of a method according to the present invention. The method of creation of a series of voltage pulses begins in step 200. In step 210, a plurality of switched pulse generator sections is charged. In step 220, switched pulse generators of a first subset of the plurality of switched pulse generator sections are connected or disconnected to and from, respectively, a load via a transformer arrangement at a first time instance. In step 230, switched pulse generators of a second subset of the plurality of switched pulse generator sections are connected or disconnected to and from, respectively, the load via the transformer arrangement at a second time instance. The second time instant is different from the first time instant. The second subset is different from the first subset. The procedure ends in step 299.

The switched pulse generator sections are preferably designed according to the principles of U.S. Pat. Nos. 5,905, 646 and 6,741,484 B2, which hereby are incorporated by reference in their entirety. However, other types of designs of switched pulse generator sections and switches can also be used. Switched pulse generator sections based on high-voltage capacitors followed by pulse-forming networks are indeed possible to use. Such solutions are often based on switches such as thyratron switches or silicon controlled rectifier switches. These types of switches also admit electronically controlled turn-on. However, such switches have the disadvantage of not being possible to turn off on demand. Instead, they will continue to be turned on until the entire charge is delivered. This means that some of the above mentioned embodiments are not possible to achieve with such solutions. Preferred embodiments therefore use switches that are controllable at both turn on and turn off.

As seen from the different embodiments above, there are three main blocks contributing to the operation of the power modulator; the power supply arrangement, the pulse generation arrangement and the transformer arrangement. The design of each block is somewhat independent of each other in that sense that most combinations of alternatives are possible to get operational, at least for certain power or voltage demands. This means that different part solutions in the different embodiments can be combined in other configurations, where technically possible. However, since these blocks in practice operate together, there have to be some concerns about selecting alternatives that are appropriate for all blocks of the power modulator. In some of the embodiments above, preferences of particular combinations are mentioned.

In particular, the power supply arrangement can comprise one power supply or a plurality of power supplies. If there are as many power supplies as switched pulse generator sections, each switched pulse generator section can be constantly connected to one power supply each. Switched pulse generator sections providing the same output voltage may be constantly connected to a common power supply. In cases the switched pulse generator sections provide different voltages, either at least one power supply per output voltage has to be provided or a switch arrangement that at the same time only connects a power supply to switched pulse generator sections providing the same output voltage.

At the transformer side, a transformer arrangement can be provided in different manners. Each switched pulse generator section may have its own transformer, which are mutually connected at the secondary side. A common transformer can also be provided, to which more than one switched pulse generator section is connected. The switched pulse generator sections can be magnetically coupled by being connected to the primary side of the common transformer either electrically decoupled or electrically coupled.

A typical pulse repetition rate is 1 Hz to 1000 Hz or even to 15000 Hz, which means that a typical lowest possible pulse repetition time ranges from about 70 microseconds to 1 second. When different voltages are used for the different subsets, the most crucial time is the change-over time between the different voltages to be applied. The switched pulse generator sections need in general some time to change from one voltage setting to another, and the present invention becomes even more useful when a difference between the on or off time instants for the two subsets differ by less than such a change-over time.

The invention is of most benefit for high voltage and/or power outputs, preferably higher than 1 kV or 1 kW, respectively. The benefit increases generally with voltage and/or power, since there are generally less alternatives available. The invention is therefore more preferred for powers above 10 kW and even more preferred above 50 kW. Similarly, the invention is more preferred for voltages above 10 kV and even more preferred above 100 kV.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A power modulator comprising:
a plurality of switched pulse generator sections;
a power supply arrangement connected to inputs of said plurality of switched pulse generator sections for supplying power thereto;
a transformer arrangement, a primary side of which being connected to outputs of said plurality of switched pulse generator sections;
said transformer arrangement having an output connected to a secondary side of said transformer arrangement;
a switch control, being connected to said plurality of switched pulse generator sections for providing control signals for at least one of turning on and turning off said plurality of switched pulse generator sections;
said switch control being arranged to provide control signals for at least one of turning on and turning off switched pulse generator sections of a first subset of said plurality of switched pulse generator sections at a first time instant and to provide control signals for at least one of turning on and turning off switched pulse generator sections of a second subset of said plurality of switched pulse generator sections at a second time instant, different from said first time instant, said second subset being different from said first subset.

2. The power modulator according to claim 1, wherein said power supply arrangement comprises a connection arrangement enabling connection of a power supply unit to more than one switched pulse generator section.

3. The power modulator according to claim 2, wherein said connection arrangement further comprises switches for enabling connection and disconnection of selected switched pulse generator sections.

4. The power modulator according to claim 1, wherein said power supply arrangement comprises a power supply for each switched pulse generator section.

5. The power modulator according to claim 1, wherein said transformer arrangement comprises a common transformer, to a primary side of which at least two of said switched pulse generator sections are connected, thereby being magnetically coupled.

6. The power modulator according to claim 5, wherein said at least two of said switched pulse generator sections are connected to said primary side of said common transformer electrically decoupled from each other.

7. The power modulator according to claim 1, wherein said transformer arrangement comprises one transformer for each subset.

8. The power modulator according to claim 1, wherein said switched pulse generator sections are solid-state switched pulse generator sections, electronically controllable at turn-on and turn-off.

9. The power modulator according to claim 1, wherein said time instants are separated by less than 1 s.

10. The power modulator according to claim 1, wherein said time instants are separated by less than a lowest possible pulse repetition time for said switched pulse generator sections.

11. The power modulator according to claim 1, wherein said time instants are separated by less than 200 μs.

12. The power modulator according to claim 1, wherein said switched pulse generator sections of said first subset are arranged to supply pulses of a first voltage and said switched pulse generator sections of said second subset are arranged to supply pulses of a second voltage, different from said first voltage.

13. The power modulator according to claim 12, wherein said first and second voltages are of opposite polarity.

14. The power modulator according to claim 12, wherein said time instances are separated by less than a change-over time between said first and second voltages of said switched pulse generator sections.

15. The power modulator according to claim 1, wherein said time instants are repeated.

16. The power modulator according to claim 1, wherein an output power of said transformer arrangement is larger than 1 kW.

17. The power modulator according to claim 1, wherein an output voltage of said transformer arrangement is larger than 1 kV.

18. Method of generation of voltage pulses, comprising the steps of:
charging a plurality of switched pulse generator sections;
at least one of connecting and disconnecting switched pulse generator sections of a first subset of said plurality of switched pulse generator sections to and from, respectively, a load via a transformer arrangement at a first time instant; and
at least one of connecting and disconnecting switched pulse generator sections of a second subset of said plurality of switched pulse generator sections to and from, respectively, said load via said transformer arrangement at a second time instant, different from said first time instant, said second subset being different from said first subset.

19. A pulse generator arrangement comprising:
a plurality of switched pulse generator sections;
each of said plurality of switched pulse generator sections having an input for receiving a supply of power;
each of said plurality of switched pulse generator sections having an output intended for providing voltage pulses to a transformer arrangement;
a switch control, being connected to said plurality of switched pulse generator sections for providing control signals for at least one of turning on and turning off said plurality of switched pulse generator sections;
said switch control being arranged to provide control signals for at least one of turning on and turning off switched pulse generator sections of a first subset of said plurality of switched pulse generator sections at a first time instant and to provide control signals for at least one of turning on and turning off switched pulse generator sections of a second subset of said plurality of switched pulse generator sections at a second time instant, different from said first time instant, said second subset being different from said first subset.

* * * * *